(12) United States Patent
Watanabe et al.

(10) Patent No.: US 11,616,486 B2
(45) Date of Patent: Mar. 28, 2023

(54) ACOUSTIC WAVE DEVICE AND ELECTRONIC COMPONENT MODULE

(71) Applicant: Murata Manufacturing Co., Ltd., Nagaokakyo (JP)

(72) Inventors: Munehisa Watanabe, Nagaokakyo (JP); Hideki Iwamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 586 days.

(21) Appl. No.: 16/715,911

(22) Filed: Dec. 16, 2019

(65) Prior Publication Data

US 2020/0204146 A1 Jun. 25, 2020

(30) Foreign Application Priority Data

Dec. 21, 2018 (JP) .............................. JP2018-239972

(51) Int. Cl.
*H03H 9/02* (2006.01)

(52) U.S. Cl.
CPC ........ *H03H 9/02015* (2013.01); *H10N 30/85* (2023.02); *H10N 30/872* (2023.02); *H10N 30/88* (2023.02); *H03H 2218/12* (2013.01)

(58) Field of Classification Search
CPC ............ H03H 9/02015; H01L 41/0472; H01L 41/053
See application file for complete search history.

(56) References Cited

U.S. PATENT DOCUMENTS

| 2007/0188047 A1* | 8/2007 | Tanaka | H03H 9/02228 310/313 D |
| 2009/0001849 A1* | 1/2009 | Tsuda | H03H 3/08 29/25.35 |
| 2016/0079370 A1* | 3/2016 | Sugiyama | H01L 21/02488 438/479 |
| 2016/0212850 A1* | 7/2016 | Kainuma | H01F 17/0013 |
| 2016/0294354 A1* | 10/2016 | Saijo | H03H 9/14544 |

(Continued)

FOREIGN PATENT DOCUMENTS

| CN | 105794107 A | 7/2016 |
| CN | 107078713 A | 8/2017 |

(Continued)

OTHER PUBLICATIONS

English Translation of JP 2000236231 (Year: 2000).*

(Continued)

*Primary Examiner* — Bryan P Gordon
(74) *Attorney, Agent, or Firm* — Keating & Bennett, LLP (57) ABSTRACT

An acoustic wave device includes a support substrate, a piezoelectric body layer, an interdigital transducer electrode, and an external connection electrode. The piezoelectric body layer is on the support substrate. The interdigital transducer electrode is on the piezoelectric body layer. The external connection electrode is electrically connected to the interdigital transducer electrode. The external connection electrode does not overlap the piezoelectric body layer in a plan view from a thickness direction of the support substrate. The support substrate includes a hollow portion. The hollow portion is at least on an end portion of the support substrate in a plan view from the thickness direction.

20 Claims, 5 Drawing Sheets

(56) References Cited

U.S. PATENT DOCUMENTS

| | | |
|---|---|---|
| 2017/0187352 A1 | 6/2017 | Omura |
| 2018/0091116 A1 | 3/2018 | Kai |
| 2019/0165758 A1* | 5/2019 | Sakai ................ H03H 9/02834 |
| 2020/0287513 A1 | 9/2020 | Yamamoto et al. |

FOREIGN PATENT DOCUMENTS

| | | |
|---|---|---|
| JP | 2000-236231 A | 8/2000 |
| JP | 2007-251910 A | 9/2007 |
| JP | 3187231 U | 11/2013 |
| KR | 10-2017-0030627 A | 3/2017 |
| WO | 2015/098679 A1 | 7/2015 |
| WO | 2016/208427 A1 | 12/2016 |
| WO | 2017/209131 A1 | 12/2017 |

OTHER PUBLICATIONS

Official Communication issued in corresponding Japanese Patent Application No. 2018-239972, dated Jan. 19, 2021.
First Office Action in CN201911299188.3, dated Jan. 19, 2023, 7 pages.

* cited by examiner

ACOUSTIC WAVE DEVICE AND ELECTRONIC COMPONENT MODULE

CROSS REFERENCE TO RELATED APPLICATIONS

This application claims the benefit of priority to Japanese Patent Application No. 2018-239972 filed on Dec. 21, 2018. The entire contents of this application are hereby incorporated herein by reference.

BACKGROUND

1. Technological Field

The present disclosure relates to an acoustic wave device and an electronic component module, and more particularly, to an acoustic wave device and an electronic component module mounted on a mounting substrate.

2. Description of the Related Art

An acoustic wave device in which a layered film including a piezoelectric thin film (piezoelectric body layer) is laminated on a support substrate has been known (see, for example, International Publication No. 2016/208427). The acoustic wave device described in International Publication No. 2016/208427 includes a support substrate, a layered film, an interdigital transducer electrode, a wiring electrode, an under-bump metal layer, and a metal bump (external connection electrode).

In the acoustic wave device described in International Publication No. 2016/208427, a portion of the wiring electrode to which the under-bump metal layer is bonded becomes an electrode land to which an external connection terminal is connected, and the electrode land is provided in a region where no layered film is present in a plan view. Therefore, stress at the time of bonding the metal bumps as the external connection terminals is not directly applied to a layered portion of the layered film.

When the acoustic wave device described in International Publication No. 2016/208427 is mounted on a mounting substrate, when a coefficient of linear expansion of the support substrate and a coefficient of linear expansion of the mounting substrate are different from each other, stress strain may occur in a central portion of the support substrate due to a difference in coefficient of linear expansion, and characteristics of the acoustic wave device may deteriorate due to this stress strain.

SUMMARY

Preferred embodiments of the present invention provide acoustic wave devices that are each capable of reducing or preventing deterioration in characteristics of the acoustic wave devices, and electronic component modules.

An acoustic wave device according to a preferred embodiment of the present invention includes a support substrate, a piezoelectric body layer, an interdigital transducer electrode, and an external connection electrode. The piezoelectric body layer is provided on the support substrate. The interdigital transducer electrode is provided on the piezoelectric body layer. The external connection electrode is electrically connected to the interdigital transducer electrode. The external connection electrode does not overlap the piezoelectric body layer in a plan view from a thickness direction of the support substrate. The support substrate includes a hollow portion. The hollow portion is provided at least on an end portion of the support substrate in a plan view from the thickness direction.

An electronic component module according to a preferred embodiment of the present invention includes an acoustic wave device according to a preferred embodiment of the present invention, and a mounting substrate on which the acoustic wave device is mounted.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, acoustic wave devices and electronic component modules according to first to fourth preferred embodiments will be described with reference to the drawings.

FIG. 1, FIG. 3, FIG. 4, and FIG. 5 referred to in the following first to fourth preferred embodiments are schematic views, and the ratio of the size or thickness of each element in the figures does not always reflect the actual dimension ratio.

First Preferred Embodiment

1. Entire Configuration of Electronic Component Module

Hereinafter, an electronic component module 100 according to a first preferred embodiment of the present invention will be described with reference to the drawings.

Figure 1:
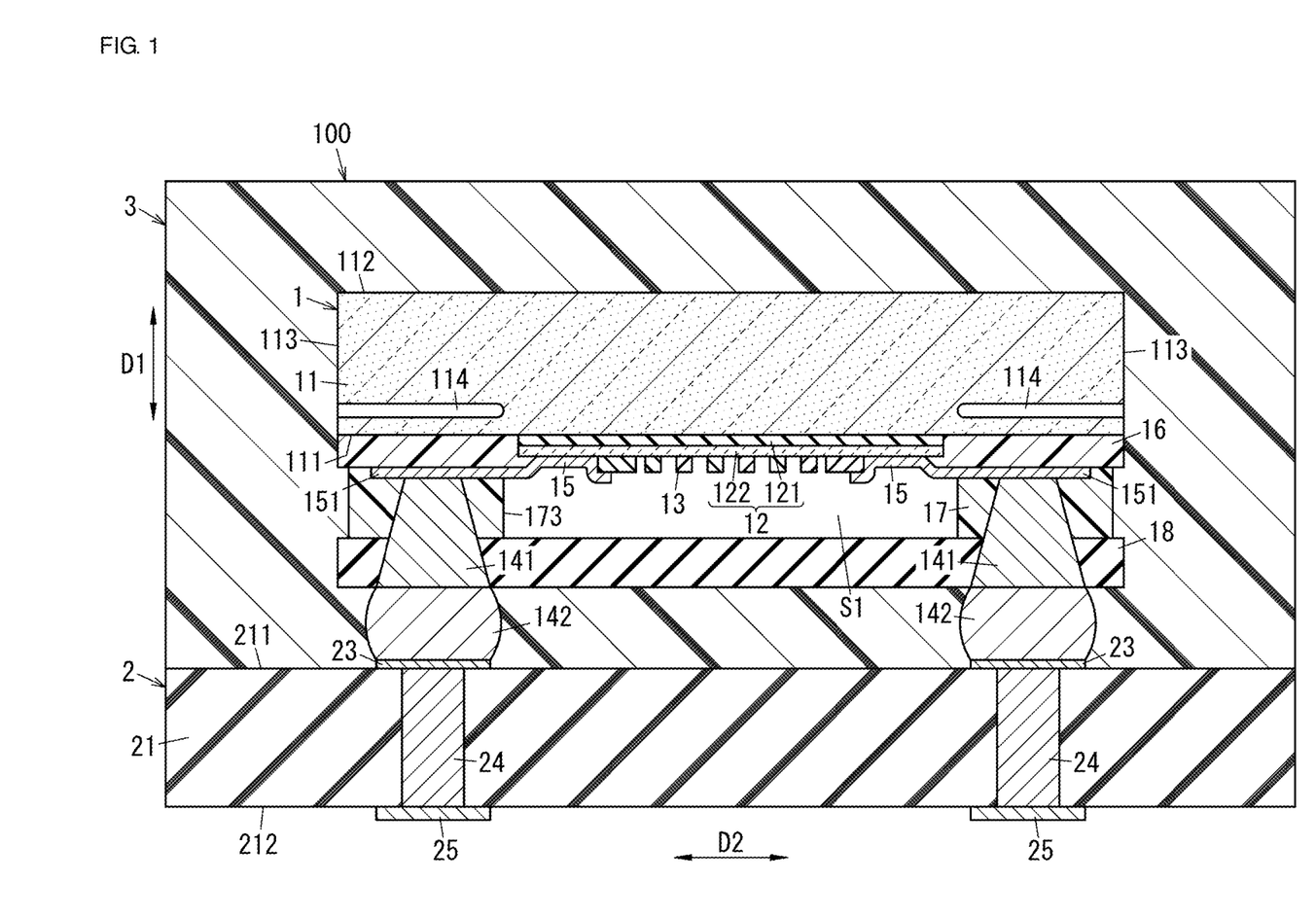
FIG. 1 is a cross-sectional view of an acoustic wave device and an electronic component module according to a first preferred embodiment of the present invention.

As illustrated in FIG. 1, the electronic component module 100 according to the first preferred embodiment includes an acoustic wave device 1, a mounting substrate 2, and a protective layer 3. The acoustic wave device 1 is mounted on the mounting substrate 2. The protective layer 3 protects the acoustic wave device 1.

The acoustic wave device 1 includes a support substrate 11, a piezoelectric body layer 122, an interdigital transducer (IDT) electrode 13, and an external connection electrode 142. The piezoelectric body layer 122 is provided directly or indirectly on the support substrate 11. In the acoustic wave device 1 according to the first preferred embodiment, the piezoelectric body layer 122 is indirectly provided on the support substrate 11. The interdigital transducer electrode 13 is provided on the piezoelectric body layer 122. Here, the term "provided on the piezoelectric body layer 122" includes a case where it is directly provided on the piezoelectric body layer 122, and a case where it is indirectly provided on the piezoelectric body layer 122. The external connection electrode 142 is electrically connected to the mounting substrate 2 and the interdigital transducer electrode 13.

The external connection electrode 142 does not overlap the piezoelectric body layer 122 in a plan view from a thickness direction D1 of the support substrate 11. The support substrate 11 includes a hollow portion 114. The hollow portion 114 is provided at least on an end portion of the support substrate 11 in a plan view from the thickness direction D1 of the support substrate 11. In the acoustic wave device 1 according to the first preferred embodiment, the hollow portion 114 extends from an end portion of the support substrate 11 to a position overlapping a spacer layer 17 (to be described later) in a plan view from the thickness direction D1 of the support substrate 11. The acoustic wave device 1 includes a functional layer 12 provided on the support substrate 11 between the support substrate 11 and the interdigital transducer electrode 13, and including at least the piezoelectric body layer 122. Here, in the acoustic wave device 1 according to the first preferred embodiment, the thickness direction D1 of the support substrate 11 is a first direction (hereinafter also referred to as "first direction D1").

The acoustic wave device 1 further includes an insulating layer 16 and a wiring electrode 15. The insulating layer 16 is provided on the support substrate 11. Here, the term "provided on the support substrate 11" includes a case where it is directly provided on the support substrate 11 and a case where it is indirectly provided on the support substrate 11. At least a portion of the wiring electrode 15 is provided on the insulating layer 16, and is electrically connected to the interdigital transducer electrode 13. Here, the term "provided on the insulating layer 16" includes a case where it is directly provided on the insulating layer 16 and a case where it is indirectly provided on the insulating layer 16.

The acoustic wave device 1 further includes a spacer layer 17 and a cover 18. The spacer layer 17 is provided on the support substrate 11. Here, the term "provided on the support substrate 11" includes a case where it is directly provided on the support substrate 11 and a case where it is indirectly provided on the support substrate 11. The cover 18 is provided on the spacer layer 17. Here, the term "provided on the spacer layer 17" includes a case where it is directly provided on the spacer layer 17 and a case where it is indirectly provided on the spacer layer 17. The external connection electrode 142 is provided on the cover 18. Here, the term "provided on the cover 18" includes a case where it is provided directly on the cover 18 and a case where it is provided indirectly on the cover 18.

In the electronic component module 100 according to the first preferred embodiment, the acoustic wave device 1 is mechanically and electrically connected to the mounting substrate 2 with the external connection electrode 142 interposed therebetween.

2. Each Element of Acoustic Wave Device

Next, each element of the acoustic wave device 1 will be described with reference to the drawings.
2.1. Support Substrate
As illustrated in FIG. 1, the support substrate 11 supports a multilayer body including the piezoelectric body layer 122 and the interdigital transducer electrode 13. The support substrate 11 includes a first main surface 111 and a second main surface 112 which are on opposite sides to each other in the thickness direction D1 thereof. The first main surface 111 and the second main surface 112 are back to back with each other. The shape of the support substrate 11 in a plan view (an outer peripheral shape when the support substrate 11 is viewed from the thickness direction D1) is preferably rectangular or substantially rectangular, but is not limited to a rectangular or substantially rectangular shape, and may be a square or substantially square shape, for example.

The support substrate 11 is a crystal substrate. Specifically, the support substrate 11 is preferably a crystal substrate having a cubic system crystal structure, for example. As an example, the support substrate 11 is preferably a silicon substrate. The surface (the first main surface 111) of the support substrate 11 on the piezoelectric body layer 122 side is a (111) plane. Here, the expression "the first main surface 111 of the support substrate 11 is the (111) plane" means that the first main surface 111 of the support substrate 11 is not limited to the (111) plane and includes a crystal plane having an off-angle from the (111) plane of greater than about 0 degrees and equal to or less than about 5 degrees.

The support substrate 11 defines a high acoustic velocity support substrate. In the high acoustic velocity support substrate, the acoustic velocity of a bulk wave propagating through the high acoustic velocity support substrate is higher than the acoustic velocity of the acoustic wave propagating through the piezoelectric body layer 122. The support substrate 11 may preferably be, for example, a germanium substrate, a diamond substrate or the like as a crystal substrate having a crystal structure, other than a silicon substrate. Therefore, a material of the support substrate 11 is not limited to silicon, and may be germanium, diamond or the like, for example. A coefficient of linear expansion of the support substrate 11 is preferably, for example, about 4 ppm/° C.

Further, the support substrate 11 includes a plurality of (for example, two in FIG. 1) hollow portions 114. Each hollow portion 114 is provided along the first main surface 111 of the support substrate 11 from an end portion (left end portion or right end portion in FIG. 1) of the support substrate 11 in a second direction D2 orthogonal or substantially orthogonal to the first direction D1. Specifically, each hollow portion 114 extends from the end portion of the support substrate 11 to a position overlapping the spacer layer 17 in a plan view from the first direction D1. In other words, each hollow portion 114 does not extend to a position overlapping the interdigital transducer electrode 13 in a plan view from the first direction D1. In other words, each hollow portion 114 is not provided immediately below the interdigital transducer electrode 13 in a plan view from the first direction D1.

Each hollow portion 114 is provided on the first main surface 111 side relative to the second main surface 112 in the first direction D1 (thickness direction D1 of the support substrate 11). A width dimension of each hollow portion 114 in the first direction D1 is preferably, for example, about 1 μm. Further, a length dimension of each hollow portion 114 in the second direction D2 is preferably about 70 μm, for example. Each hollow portion 114 preferably has a depth of, for example, about 1 μm from the first main surface 111 of the support substrate 11 in the first direction D1. In the acoustic wave device 1 according to the first preferred embodiment, the plurality of hollow portions 114 are provided in a portion in a circumferential direction of the support substrate 11 in a plan view from the first direction D1. A forming method of the hollow portion 114 will be described in the "6. Forming Method of Hollow Portion".

2.2. Interdigital Transducer Electrode

The interdigital transducer electrode 13 includes a first busbar, a second busbar, a plurality of first electrode fingers, and a plurality of second electrode fingers. The interdigital transducer electrode 13 is provided on the piezoelectric body layer 122.

The first busbar preferably has an elongated or substantially elongated shape in which the second direction D2 is a longitudinal direction, and is electrically connected to the plurality of first electrode fingers. The second busbar preferably has an elongated or substantially elongated shape in which the second direction D2 is the longitudinal direction, and is electrically connected to the plurality of second electrode fingers.

The plurality of first electrode fingers are arranged side by side in the second direction D2. Each first electrode finger preferably has an elongated or substantially elongated shape in which a third direction is the longitudinal direction. The plurality of first electrode fingers are arranged in parallel or substantially in parallel in a state of facing each other in the second direction D2. The plurality of second electrode fingers are arranged side by side in the second direction D2. Each second electrode finger preferably has an elongated or substantially elongated shape in which the third direction is the longitudinal direction. The plurality of second electrode fingers are arranged in parallel or substantially in parallel in a state of facing each other in the second direction D2. The plurality of first electrode fingers and the plurality of second electrode fingers are alternately arranged one by one. The third direction is a direction orthogonal or substantially orthogonal to both of the first direction D1 and the second direction D2.

When widths of the first electrode finger and the second electrode finger are WA, and a space width between adjacent first electrode finger and the second electrode finger is SA, a duty ratio is defined as WA/(WA+SA) in the interdigital transducer electrode 13. The duty ratio of the interdigital transducer electrode 13 is preferably, for example, about 0.5. When a wavelength of the acoustic wave determined by an electrode finger period of the interdigital transducer electrode 13 is $\lambda$, the wavelength $\lambda$ is equal to the electrode finger period. The electrode finger period is defined as a repetition period P$\lambda$A of the plurality of first electrode fingers or the plurality of second electrode fingers. Therefore, the repetition period P$\lambda$A and $\lambda$ are equal to each other. The duty ratio of the interdigital transducer electrode 13 is a ratio of the width WA of the first electrode finger and the second electrode finger with respect to a value (WA+SA) of half of the electrode finger period.

A material of the interdigital transducer electrode 13 is preferably, for example, an appropriate metal material such as aluminum (Al), copper (Cu), platinum (Pt), gold (Au), silver (Ag), titanium (Ti), nickel (Ni), chromium (Cr), molybdenum (Mo), or tungsten (W), or an alloy containing any one of these metals as a main component. The interdigital transducer electrode 13 may have a structure in which a plurality of metal films made of these metals or an alloy thereof are stacked.

2.3. Functional Layer

The functional layer 12 includes a low acoustic velocity film 121 and the piezoelectric body layer 122. The piezoelectric body layer 122 is preferably, for example, a piezoelectric film (hereinafter, also referred to as a "piezoelectric film 122"). The piezoelectric film 122 is provided directly or indirectly on the low acoustic velocity film 121. Accordingly, the piezoelectric film 122 is indirectly provided on the support substrate 11 defining the high acoustic velocity support substrate. In the low acoustic velocity film 121, the acoustic velocity of a bulk wave propagating through the low acoustic velocity film 121 is lower than the acoustic velocity of a bulk wave propagating through the piezoelectric film 122.

Here, since the low acoustic velocity film 121 is provided between the support substrate 11 which is the high acoustic velocity support substrate and the piezoelectric film 122, the acoustic velocity of the acoustic wave is reduced. The acoustic wave has a property that energy is essentially concentrated in a medium having a low acoustic velocity. Therefore, the effect of confining the energy of the acoustic wave in the piezoelectric film 122 and in the interdigital transducer electrode 13 in which the acoustic wave is excited is improved. As a result, a loss can be reduced and a Q value can be increased as compared to a case where the low acoustic velocity film 121 is not provided.

A thickness of the piezoelectric film 122 is preferably, for example, equal to or less than about 3.5$\lambda$ when the wavelength of the acoustic wave determined by the electrode finger period of the interdigital transducer electrode 13 is $\lambda$. When the thickness of the piezoelectric film 122 is equal to or less than about 3.5$\lambda$, the Q value is increased. Further, by setting the thickness of the piezoelectric film 122 to equal to or less than about 2.5$\lambda$, a temperature coefficient of frequency (TCF) can be reduced. Further, by setting the thickness of the piezoelectric film 122 to equal to or less than about 1.5$\lambda$, it is possible to easily adjust the acoustic velocity of the acoustic wave. Note that the thickness of the piezoelectric film 122 is not limited to equal to or less than about 3.5$\lambda$, and may be larger than about 3.5$\lambda$.

A material of the piezoelectric film 122 is not limited to lithium tantalate (LiTaO$_3$), and may be lithium niobate (LiNbO$_3$), zinc oxide (ZnO), aluminum nitride (AlN), or lead zirconate titanate (PZT), for example.

It is preferable that a thickness of the low acoustic velocity film 121 is equal to or less than about 2.0$\lambda$, assuming that the wavelength of the acoustic wave determined by the electrode finger period of the interdigital transducer electrode 13 is $\lambda$. The thickness of the low acoustic velocity film 121 is preferably, for example, about 670 nm. By setting the thickness of the low acoustic velocity film 121 to equal to or less than about 2.0$\lambda$, for example, film stress can be reduced or prevented, and as a result, warpage of a wafer which becomes a base of the high acoustic velocity support substrate at the time of manufacturing the acoustic wave device 1 can be reduced or prevented, thus improving the good product ratio and stabilizing the characteristics.

A material of the low acoustic velocity film 121 is preferably, for example, silicon oxide. Note that the material of the low acoustic velocity film 121 is not limited to silicon oxide. The material of the low acoustic velocity film 121 may be, for example, a compound obtained by adding fluorine, carbon or boron to silicon oxide, glass, silicon oxynitride, tantalum oxide or silicon oxide, or a material including the above materials as a main component.

2.4. Wiring Electrode

The wiring electrode 15 electrically connects the external connection electrode 142 and the interdigital transducer electrode 13. A material of the wiring electrode 15 is preferably, for example, an appropriate metal material such as aluminum, copper, platinum, gold, silver, titanium, nickel, chromium, molybdenum, or tungsten, or an alloy including any one of these metals as a main component. Further, the wiring electrode 15 may have a structure in which a plurality of metal films made of these metals or an alloy thereof are stacked.

The wiring electrode 15 overlaps a portion of the interdigital transducer electrode 13, a portion of the piezoelectric film 122, and a portion of the insulating layer 16 in the thickness direction D1 of the support substrate 11. In the wiring electrode 15, the external connection electrode 142 is provided on a portion 151 provided on the insulating layer 16. The wiring electrode 15 is located inside the outer periphery of the insulating layer 16 in a plan view from the thickness direction D1 of the support substrate 11.

2.5. Insulating Layer

The insulating layer 16 has electrical insulation properties. The insulating layer 16 is provided along the outer periphery of the support substrate 11 on the first main surface 111 of the support substrate 11. The insulating layer 16 surrounds a side surface of the functional layer 12. The shape of the insulating layer 16 in a plan view is preferably a substantial frame shape (for example, a rectangular or substantially rectangular frame shape). A portion of the insulating layer 16 overlaps an outer peripheral portion of the functional layer 12 in the thickness direction D1 of the support substrate 11. That is, the side surface of the functional layer 12 is covered with the insulating layer 16.

A material of the insulating layer 16 is preferably, for example, a synthetic resin, such as an epoxy resin or a polyimide.

2.6. Spacer Layer

The spacer layer 17 includes a through-hole 173. The spacer layer 17 is provided at an outer side portion of the interdigital transducer electrode 13 in a plan view from the thickness direction D1 of the support substrate 11, and surrounds the interdigital transducer electrode 13. The spacer layer 17 is provided along the outer periphery of the support substrate 11 in a plan view from the thickness direction D1 of the support substrate 11. The shape of the spacer layer 17 in a plan view is preferably a substantial frame shape. An outer peripheral shape and an inner peripheral shape of the spacer layer 17 are preferably, for example, a rectangular or substantially rectangular shape. The spacer layer 17 overlaps the insulating layer 16 in the thickness direction D1 of the support substrate 11. An outer peripheral end of the spacer layer 17 is located inside an outer peripheral end of the insulating layer 16. An inner peripheral end of the spacer layer 17 is located at an outer side portion of an inner peripheral end of the insulating layer 16. A portion of the spacer layer 17 also covers the wiring electrode 15 provided on the insulating layer 16. The spacer layer 17 includes a first portion provided directly on the surface of the insulating layer 16 and a second portion provided indirectly on the surface of the insulating layer 16 with the wiring electrode 15 interposed therebetween. Here, the first portion is provided over the entire or substantially the entire periphery of the surface of the insulating layer 16.

The spacer layer 17 has electrical insulation properties. A material of the spacer layer 17 is preferably, for example, a synthetic resin, such as an epoxy resin or a polyimide. The material of the spacer layer 17 preferably includes the same main component as the material of the insulating layer 16, and is more preferably the same material as the insulating layer 16.

A total thickness of the thickness of the spacer layer 17 and the thickness of the insulating layer 16 is larger than a total thickness of the thickness of the functional layer 12 and the thickness of the interdigital transducer electrode 13.

2.7. Cover

The cover 18 has a substantially flat plate shape. Although the shape of the cover 18 in a plan view (the outer peripheral shape when viewed from the thickness direction D1 of the support substrate 11) is rectangular or substantially rectangular, the shape is not limited to a rectangular or substantially rectangular shape, and may be a square or substantially square shape, for example. The outer peripheral shape of the cover 18 is substantially the same size as the outer peripheral shape of the support substrate 11. The cover 18 is disposed on the spacer layer 17 so as to close the through-hole 173 of the spacer layer 17. The cover 18 is spaced apart from the interdigital transducer electrode 13 in the thickness direction D1 of the support substrate 11.

The cover 18 has electrical insulation properties. A material of the cover 18 is preferably, for example, a synthetic resin such as an epoxy resin or a polyimide. The material of the cover 18 preferably contains the same main component as the material of the spacer layer 17, and is more preferably the same material as the spacer layer 17.

The acoustic wave device 1 according to the first preferred embodiment includes a space S1. The space S1 is surrounded by the cover 18, the spacer layer 17, the insulating layer 16, and the multilayer body (multilayer body including the piezoelectric film 122 and the interdigital transducer electrode 13) on the support substrate 11. The space S1 is filled with a gas such as, for example, air, an inert gas (e.g., a nitrogen gas), or the like.

2.8. External Connection Electrode

The acoustic wave device 1 according to the first preferred embodiment includes a plurality of (for example, two in FIG. 1) external connection electrodes 142. Each external connection electrode 142 electrically connects to the mounting substrate 2 in the acoustic wave device 1. In the acoustic wave device 1, each of the plurality of external connection electrodes 142 does not overlap the piezoelectric film 122 in a plan view from the thickness direction D1 of the support substrate 11. Each of the external connection electrodes 142 is positioned at an outer side portion of the piezoelectric film 122 when viewed from the thickness direction D1 of the support substrate 11.

The acoustic wave device 1 is further provided with a through electrode 141. The through electrode 141 passes through the spacer layer 17 and the cover 18 in the thickness direction D1 of the support substrate 11. The through electrode 141 is provided on the wiring electrode 15, and is electrically connected to the wiring electrode 15. The through electrode 141 defines an under-bump metal layer. Further, the external connection electrode 142 is provided on the through electrode 141. The external connection electrode 142 is preferably, for example, a bump. The external connection electrode 142 is electrically conductive. The external connection electrode 142 is bonded to the through electrode 141, and is electrically connected to the through electrode 141.

A material of the through electrode 141 is preferably, for example, an appropriate metal material such as copper or nickel, or an alloy including any one of these metals as a main component. A material of the external connection electrode 142 is preferably, for example, solder, gold, copper, or the like.

3. Mounting Substrate

The mounting substrate 2 is a substrate on which the acoustic wave device 1 is mounted with the external connection electrode 142 interposed therebetween. In the electronic component module 100 according to the first preferred embodiment, one acoustic wave device 1 is mounted on the mounting substrate 2. The mounting substrate 2 is larger than the acoustic wave device 1 in a plan view from the thickness direction D1 of the support substrate 11.

The mounting substrate 2 includes the support body 21, a plurality (two in FIG. 1) of first conductor portions 23, a plurality (two in FIG. 1) of second conductor portions 25, and a plurality (two in FIG. 1) of through electrodes 24. The plurality of first conductor portions 23 and the plurality of second conductor portions 25 each are supported by the support body 21. The plurality of through electrodes 24 electrically connect the plurality of first conductor portions 23 and the plurality of second conductor portions 25 to each other in a one-to-one relationship. The plurality of second conductor portions 25 electrically connect the electronic component module 100 to a circuit board or the like.

The support body 21 has an electrical insulation property. The support body 21 has a substantially flat plate shape and includes a first main surface 211 and a second main surface 212 which are on the opposite side from each other in a thickness direction thereof. The first main surface 211 and the second main surface 212 are back to back with each other. The outer peripheral shape of the support body 21 is preferably, for example, a rectangular or substantially rectangular shape.

The first conductor portion 23 is provided on the first main surface 211 of the support body 21. The first conductor portion 23 is a conductive layer to which the external connection electrode 142 of the acoustic wave device 1 is electrically connected. A material of the first conductor portion 23 is preferably, for example, copper or the like. The first conductor portion 23 overlaps the external connection electrode 142 in the thickness direction D1 of the support substrate 11 of the acoustic wave device 1. The external connection electrode 142 is interposed between the through electrode 141 and the first conductor portion 23.

The second conductor portion 25 is provided on the second main surface 212 of the support body 21. The second conductor portion 25 is a conductive layer to which the first conductor portion 23 is electrically connected with the through electrode 24 interposed therebetween. A material of the second conductor portion 25 is preferably, for example, copper or the like.

As an example, the mounting substrate 2 is defined by a printed wiring board. A coefficient of linear expansion of the printed wiring board is, for example, about 15 ppm/° C. The printed wiring board is made of a copper-clad glass cloth/epoxy resin laminated board, for example.

The support body 21 is defined by an insulating substrate in the printed wiring board. The insulating substrate has electrical insulation properties.

The first conductor portion 23 and the second conductor portion 25 include a copper foil in the printed wiring board.

4. Protective Layer

In the electronic component module 100, the acoustic wave device 1 mounted on the mounting substrate 2 is covered with the protective layer 3. In the electronic component module 100, the second main surface 112 and each side surface 113 of the support substrate 11 of the acoustic wave device 1 are covered with the protective layer 3. A material of the protective layer 3 is preferably, for example, a synthetic resin such as an epoxy resin or a polyimide. The protective layer 3 defines and functions as a sealing layer to seal the acoustic wave device 1 on the mounting substrate 2.

The protective layer 3 has a rectangular or substantially rectangular parallelepiped shape. A portion of the protective layer 3 is also provided around the external connection electrode 142 between the cover 18 of the acoustic wave device 1 and the mounting substrate 2. That is, a portion of the protective layer 3 defines an underfill portion.

The electronic component module 100 can be surface-mounted on a mother substrate or the like different from the mounting substrate 2. In the electronic component module 100, a package is defined in which the mounting substrate 2 and the protective layer 3 protect the acoustic wave device 1 and make it possible to connect to an external electric circuit or the like. The package in the electronic component module 100 is a surface-mount package.

In a plan view from the thickness direction D1 of the support substrate 11, the outer peripheral shape of the protective layer 3 is the same or substantially the same as the outer peripheral shape of the mounting substrate 2 in dimension.

5. Manufacturing Method

Hereinafter, a non-limiting example of a method of manufacturing the acoustic wave device 1 and the electronic component module 100 will be briefly described.

5.1. Manufacturing Method of Acoustic Wave Device

First, a silicon wafer which is a base of the support substrate 11 of each of the plurality of acoustic wave devices 1 is prepared.

After the functional layer 12 including the piezoelectric film 122 is formed on one main surface of the silicon wafer, the interdigital transducer electrode 13, the insulating layer 16, the wiring electrode 15, and the spacer layer 17 are sequentially formed. Thereafter, the cover 18 is bonded to the spacer layer 17 so as to close the through-hole 173 of the spacer layer 17.

Subsequently, through-holes are formed in a portion of the cover 18 and the spacer layer 17 in which the through electrodes 141 are intended to be formed, and the through electrodes 141 are formed so as to fill the through-holes, and then the external connection electrodes 142 are formed on the through electrodes 141.

Through the processes described above, a wafer in which a plurality of acoustic wave devices 1 are formed on a silicon wafer can be obtained. One main surface of the silicon wafer corresponds to the first main surface 111 of the support substrate 11 made of a silicon substrate.

Then, by performing a dicing process to cut the wafer with a dicing machine, a plurality of acoustic wave devices 1 can be obtained from one wafer. In the dicing process, for example, a laser saw, a dicing saw, or the like is used.

5.2. Manufacturing Method of Electronic Component Module

The acoustic wave device 1 is mounted on the mounting substrate 2, and the protective layer 3 is formed so as to cover the acoustic wave device 1 on the mounting substrate 2. As such, the electronic component module 100 is formed.

6. Forming Method of Hollow Portion

Next, a non-limiting example of a molding method of the hollow portion 114 will be briefly described.

Ion implantation is performed by an ion implantation apparatus from the first main surface 111 side of the support substrate 11 to a surface layer of the first main surface 111. The ions implanted into the support substrate 11 from the ion implantation device are, for example, argon ions. Then, after the argon ions are implanted into the support substrate 11, the support substrate 11 is heated to evaporate the argon ions implanted into the support substrate 11, thus forming the hollow portion 114.

In this case, a depth position of the hollow portion 114 from the first main surface 111 can be adjusted by changing the magnitude of the acceleration voltage of the argon ion, the incident angle of the argon ion with respect to the first main surface 111 of the support substrate 11, or the like.

7. Characteristics

Characteristics of the acoustic wave device 1 and the electronic component module 100 will be described below.

7.1. Characteristics of Acoustic Wave Device

First, the characteristics of the acoustic wave device 1 will be described. In the following description, the piezoelectric film 122 is made of lithium tantalate, and the thickness of the piezoelectric film 122 is set to about 600 nm, for example. Further, the low acoustic velocity film 121 is made of silicon oxide, and the thickness of the low acoustic velocity film 121 is set to about 600 nm, for example. In addition, the support substrate 11 is made of silicon, and the thickness of the support substrate 11 is set to about 100 μm, for example.

The acoustic wave device 1 manufactured under the above conditions is placed under an environment of about 100° C., for example. In this case, since a coefficient of linear expansion of the spacer layer 17 and the cover 18 is different from that of the support substrate 11, thermal stress due to the difference in coefficient of linear expansion is generated in the support substrate 11. In the acoustic wave device 1 according to the first preferred embodiment, the hollow portion 114 is provided in the support substrate 11, and the thermal stress generated in the support substrate 11 is concentrated to a portion of the support substrate 11 in the first main surface 111 side of the hollow portion 114. As a result, thermal stress applied to a central portion of the support substrate 11, i.e., to a portion in which the piezoelectric film 122 is stacked, can be reduced or prevented compared to a case where the hollow portion 114 is not provided in the support substrate 11. Specifically, thermal stress in the case where the hollow portion 114 is not provided in the support substrate 11 is, for example, about 11 MPa, whereas thermal stress in a case where the hollow portion 114 is provided in the support substrate 11 is, for example, about 7 MPa.

By providing the hollow portion 114 in the support substrate 11 as described above, thermal stress applied to the central portion of the support substrate 11 in which the piezoelectric film 122 is stacked can be reduced or prevented, and stress strain in the central portion of the support substrate 11 due to thermal stress can be reduced or prevented. As a result, deformation of the piezoelectric film 122 stacked in the central portion of the support substrate 11 can be reduced or prevented, and deterioration in characteristics (here, piezoelectricity) of the acoustic wave device 1 due to stress strain can be reduced or prevented.

Figure 2:
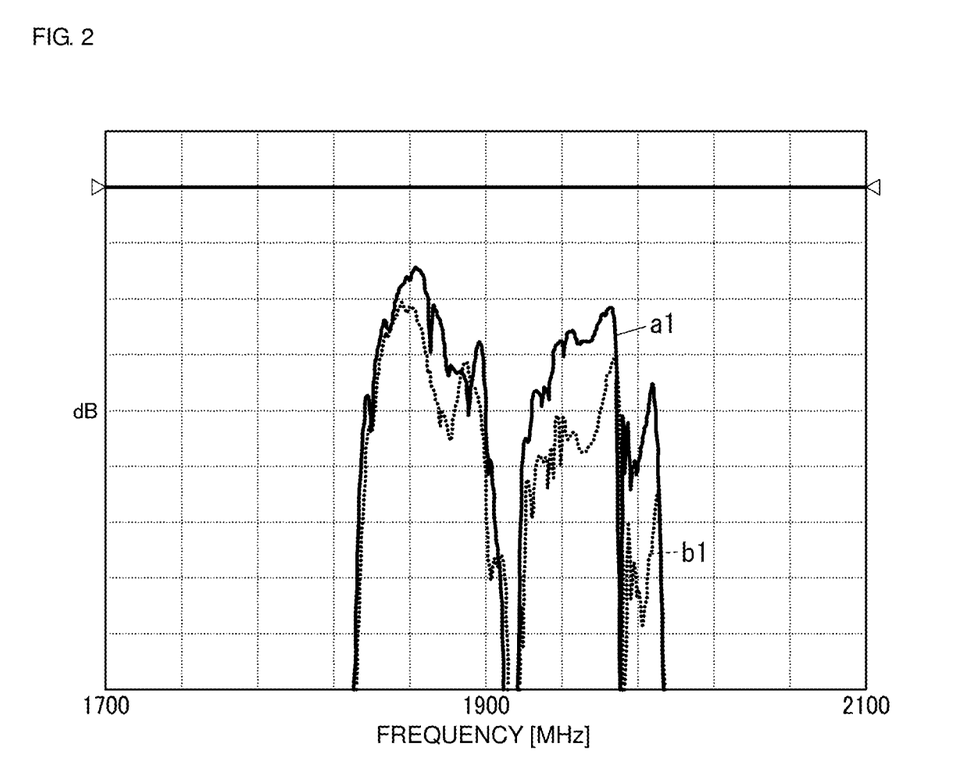
FIG. 2 is a frequency characteristic diagram of the acoustic wave device according to the first preferred embodiment of the present invention.

FIG. 2 is a frequency characteristic diagram of the acoustic wave device 1 according to the first preferred embodiment and an acoustic wave device according to a comparative example. The acoustic wave device according to the comparative example has basically the same or substantially the same configuration as that of the acoustic wave device 1 according to the first preferred embodiment, but differs from the acoustic wave device 1 according to the first preferred embodiment in that a hollow portion is not provided in the support substrate. Here, it is assumed that the acoustic wave device 1 according to the first preferred embodiment and the acoustic wave device according to the comparative example are placed under an environment of about 100° C. for a certain time.

In FIG. 2, the horizontal axis represents a frequency, and the vertical axis in FIG. 2 represents impedance. A solid line a1 in FIG. 2 indicates a frequency characteristic of the acoustic wave device 1 according to the first preferred embodiment, and a broken line b1 in FIG. 2 indicates a frequency characteristic of the acoustic wave device according to the comparative example. FIG. 2 illustrates a case where a pass band is a Band 25 (about 1900 MHz band) when the acoustic wave device 1 according to the first preferred embodiment and the acoustic wave device according to the comparative example are used as filters.

From FIG. 2, it can be seen that in the frequency band of about 1800 MHz to about 2000 MHz, the acoustic wave device 1 according to the first preferred embodiment is superior to the acoustic wave device according to the comparative example in terms of a bandpass characteristic. In other words, in the frequency band, the bandpass characteristic of the acoustic wave device according to the comparative example is deteriorated. That is, by providing the hollow portion 114 in the support substrate 11, deterioration in characteristics of the acoustic wave device 1 (here, bandpass characteristic) can be reduced or prevented.

7.2. Characteristics of Electronic Component Module

Next, characteristics of the electronic component module 100 will be described.

In the electronic component module 100 according to the first preferred embodiment, the coefficient of linear expansion of the support substrate 11 of the acoustic wave device 1 is, for example, about 4 ppm/° C. On the other hand, a coefficient of linear expansion of the mounting substrate 2 on which the acoustic wave device 1 is mounted is, for example, about 15 ppm/° C. That is, in the electronic component module 100 according to the first preferred embodiment, the coefficient of linear expansion of the support substrate 11 is different from that of the mounting substrate 2, and the coefficient of linear expansion of the mounting substrate 2 is larger than that of the support substrate 11.

Here, it is assumed that the acoustic wave device 1 is bonded to the mounting substrate 2 with the external connection electrode 142 interposed therebetween. In this case, since the coefficient of linear expansion of the mounting substrate 2 is different from that of the support substrate 11, thermal stress due to the difference in coefficient of thermal expansion is transmitted to the support substrate 11 through the spacer layer 17. In the acoustic wave device 1 according to the first preferred embodiment, the spacer layer 17 and the hollow portion 114 overlap each other in a plan view from the thickness direction D1 of the support substrate 11. Therefore, the thermal stress transmitted to the support substrate 11 is concentrated to a portion of the support substrate 11 in the first main surface 111 side of the hollow portion 114. As a result, thermal stress applied to the central portion of the support substrate 11, i.e., to the portion in which the piezoelectric film 122 is stacked, can be reduced or prevented, and stress strain in the central portion of the support substrate 11 due to thermal stress can be reduced or prevented. As a result, deformation of the piezoelectric film 122 stacked in the central portion of the support substrate 11 can be reduced or prevented, and deterioration in characteristics (here, piezoelectricity) of the acoustic wave device 1 due to stress strain can be reduced or prevented.

8. Effect

The acoustic wave device 1 according to the first preferred embodiment is mounted on the mounting substrate 2. The acoustic wave device 1 includes the support substrate 11, the piezoelectric body layer 122, the interdigital transducer electrode 13, and the external connection electrode 142. The piezoelectric body layer 122 is provided directly or indirectly on the support substrate 11. The interdigital transducer electrode 13 is provided on the piezoelectric body layer 122. The external connection electrode 142 is electrically connected to the mounting substrate 2 and the interdigital transducer electrode 13. The external connection electrode 142 does not overlap the piezoelectric body layer 122 in a plan view from the thickness direction D1 of the support substrate 11. The support substrate 11 includes the hollow portion 114. The hollow portion 114 is provided at least in an end portion of the support substrate 11 in a plan view from the thickness direction D1. Here, the term that the hollow portion 114 is provided on "at least an end portion of the support substrate 11" means that an opening is provided in a portion of the side surface connecting the first main surface 111 and the second main surface 112 of the support substrate 11, and the hollow portion 114 includes at least the opening. In other words, the "end portion of the support substrate 11" refers to any portion of the side surfaces of the support substrate 11.

In the acoustic wave device 1 according to the first preferred embodiment, the hollow portion 114 is provided at least on the end portion of the support substrate 11. For this reason, for example, when the coefficient of linear expansion of the support substrate 11 is different from that of the mounting substrate 2, and thermal stress is generated in the support substrate 11, thermal stress is concentrated to a portion of the support substrate 11 in the first main surface 111 side of the hollow portion 114. Thus, thermal stress applied to the central portion of the support substrate 11 can be reduced or prevented, and stress strain in the central portion of the support substrate 11 due to the thermal stress can be reduced or prevented. As a result, deformation of the piezoelectric film 122 stacked in the central portion of the support substrate 11 can be reduced or prevented, and deterioration in characteristics (here, piezoelectricity) of the acoustic wave device 1 due to stress strain can be reduced or prevented.

In the acoustic wave device 1 according to the first preferred embodiment, the external connection electrode 142 and the piezoelectric body layer 122 do not overlap each other in a plan view from the thickness direction D1 of the support substrate 11. Therefore, in forming the external connection electrode 142 at the time of manufacturing, it is possible to reduce or prevent force from being applied to the piezoelectric body layer 122 from the external connection electrode 142, and it is possible to reduce or prevent the occurrence of cracking or chipping in the piezoelectric body layer 122.

9. Modified Example

A modified example of the first preferred embodiment of the present invention will be described below.

In the first preferred embodiment, the hollow portion 114 is provided in a portion of the support substrate 11 in the circumferential direction in a plan view from the thickness direction D1 of the support substrate 11, but the hollow portion may be provided over the entire or substantially the entire circumference of the support substrate 11. According to this configuration, the influence of thermal stress on the piezoelectric body layer 122 can be effectively reduced or prevented as compared to a case where the hollow portion 114 is provided in a portion of the support substrate 11 in the circumferential direction.

In the first preferred embodiment, the hollow portion 114 extends from the end portion of the support substrate 11 to a position overlapping the spacer layer 17 in a plan view from the thickness direction D1 of the support substrate 11. In contrast, the hollow portion may be provided at least on the end portion of the support substrate 11 in a plan view from the thickness direction D1 of the support substrate 11. More preferably, the hollow portion may extend from the end portion of the support substrate 11 to at least a position overlapping the external connection electrode 142, in a plan view from the thickness direction D1 of the support substrate 11. More preferably, the hollow portion may extend from the end portion of the support substrate 11 to a position overlapping both the external connection electrode 142 and the spacer layer 17 in a plan view from the thickness direction D1 of the support substrate 11.

In the first preferred embodiment, the first main surface 111 of the support substrate 11 is the (111) plane, but the first main surface 111 is not limited to the (111) plane, and may be a (100) plane or the like.

In the first preferred embodiment, the hollow portion 114 is provided in the support substrate 11 nearer to the first main surface 111 side than to the second main surface 112 side in the thickness direction of the support substrate 11, but the hollow portion may be provided nearer to the second main surface 112 side than to the first main surface 111 side in the thickness direction D1.

Second Preferred Embodiment

Figure 3:
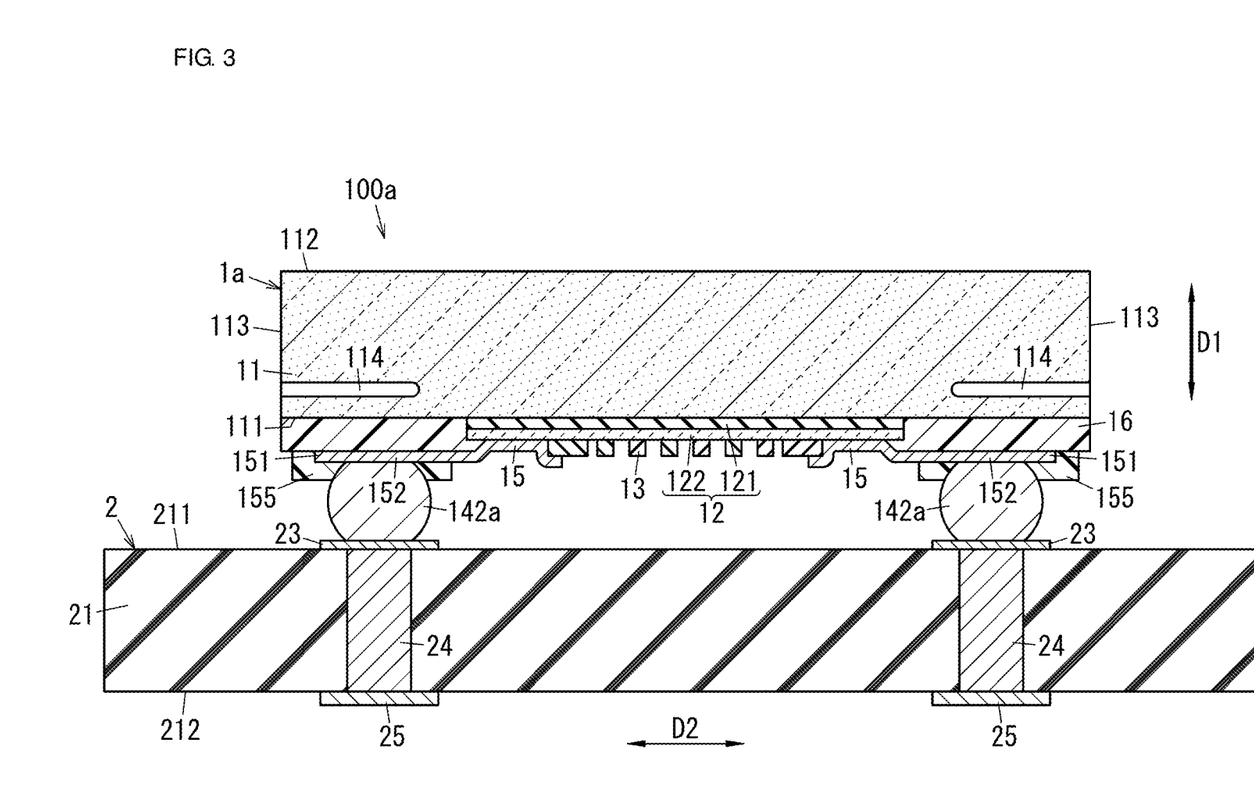
FIG. 3 is a cross-sectional view of an acoustic wave device and an electronic component module according to a second preferred embodiment of the present invention.

An electronic component module 100a according to a second preferred embodiment of the present invention is different from the electronic component module 100 according to the first preferred embodiment in that an external connection electrode 142a is directly provided on the wiring electrode 15 as illustrated in FIG. 3. Regarding the electronic component module 100a according to the second preferred embodiment, elements the same as or similar to those of the electronic component module 100 according to the first preferred embodiment are denoted by the same reference signs, and description thereof will not be repeated.

In the electronic component module 100a according to the second preferred embodiment, an acoustic wave device 1a does not include the spacer layer 17, the cover 18, the through electrode 141, and the like in the acoustic wave device 1 of the electronic component module 100 according to the first preferred embodiment. In the electronic component module 100a, the external connection electrode 142a is directly provided on the wiring electrode 15. The external connection electrode 142a is preferably, for example, a bump. A material of the bump is preferably, for example, solder, Au or the like.

The electronic component module 100a further includes a resist layer 155. The resist layer 155 covers the peripheral portion of the portion 151 provided on the insulating layer 16 in the wiring electrode 15. In the electronic component module 100a, the portion of the wiring electrode 15 which is not covered by the resist layer 155 in the portion 151 provided on the insulating layer 16 defines a pad electrode 152. The external connection electrode 142a is provided on the pad electrode 152 of the wiring electrode 15.

The electronic component module 100a according to the second preferred embodiment may include a protective layer covering the acoustic wave device 1a on the mounting substrate 2, similar to the protective layer 3 of the electronic component module 100 according to the first preferred embodiment.

In the electronic component module 100a according to the second preferred embodiment, the hollow portion 114 is provided in the support substrate 11 of the acoustic wave device 1a, similarly to the electronic component module 100 according to the first preferred embodiment. For this reason, for example, when the coefficient of linear expansion of the support substrate 11 is different from that of the mounting substrate 2, and thermal stress is generated in the support substrate 11, the thermal stress is concentrated to a portion of the support substrate 11 in the first main surface 111 side of the hollow portion 114. Thus, thermal stress applied to the central portion of the support substrate 11 can be reduced or prevented, and stress strain in the central portion of the support substrate 11 due to the thermal stress can be reduced or prevented. As a result, deformation of the piezoelectric film 122 stacked on the central portion of the support substrate 11 can be reduced or prevented, and deterioration in characteristics (here, piezoelectricity) of the acoustic wave device 1a due to stress strain can be reduced or prevented.

Figure 4:
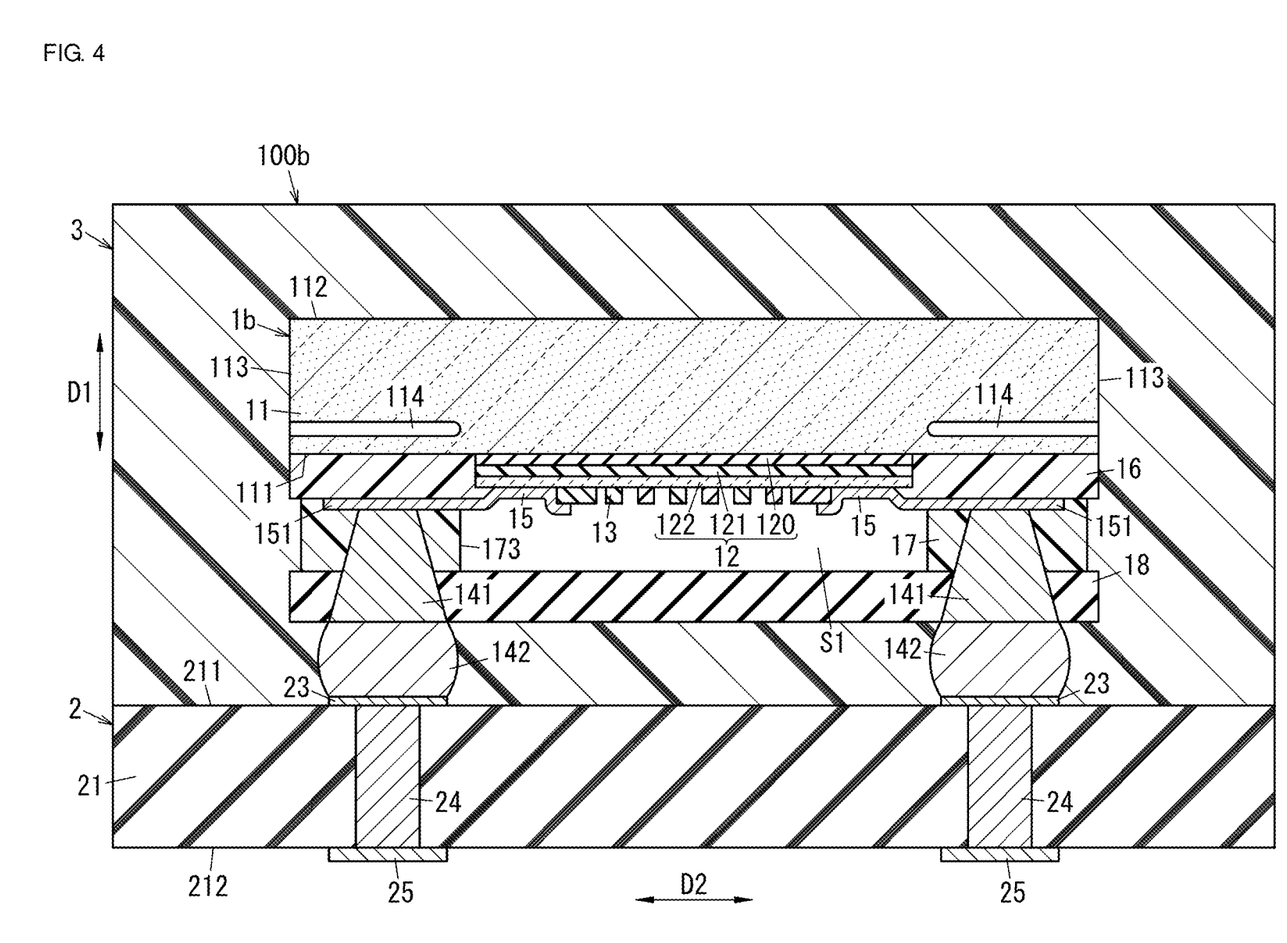
FIG. 4 is a cross-sectional view of an acoustic wave device and an electronic component module according to a third preferred embodiment of the present invention.
Figure 5:
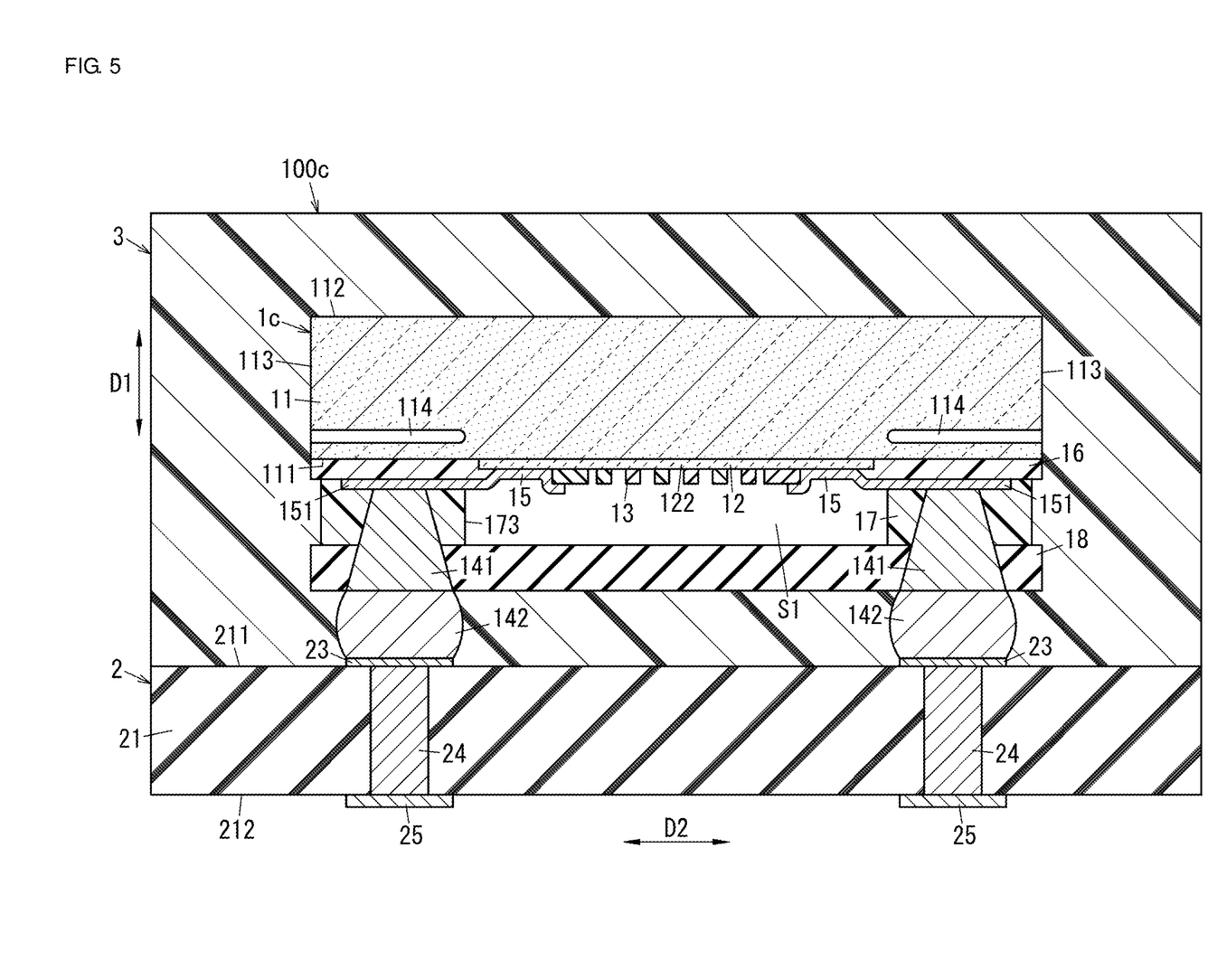
FIG. 5 is a cross-sectional view of an acoustic wave device and an electronic component module according to a fourth preferred embodiment of the present invention.

Any one of the configurations according to the modified example of the first preferred embodiment may be combined with the electronic component module 100a according to the second preferred embodiment. Further, as illustrated in FIG. 4 which will be described later, the functional layer 12 may include a high acoustic velocity film 120 in addition to the low acoustic velocity film 121 and the piezoelectric film 122, or the functional layer 12 may include only the piezoelectric film 122 as illustrated in FIG. 5 which will be described later. Further, the support substrate 11 and the piezoelectric film 122 may be integrally provided. That is, the support substrate 11 may be a piezoelectric substrate.

Third Preferred Embodiment

In an electronic component module 100b according to a third preferred embodiment of the present invention, as illustrated in FIG. 4, the functional layer 12 in an acoustic wave device 1b includes the high acoustic velocity film 120, the low acoustic velocity film 121, and the piezoelectric film (piezoelectric body layer) 122. The high acoustic velocity film 120 is provided directly or indirectly on the support substrate 11. In the high acoustic velocity film 120, an acoustic velocity of a bulk wave propagating through the high acoustic velocity film 120 is higher than an acoustic velocity of the acoustic wave propagating through the piezoelectric film 122. The low acoustic velocity film 121 is provided directly or indirectly on the high acoustic velocity film 120. In the low acoustic velocity film 121, an acoustic velocity of a bulk wave propagating through the low acoustic velocity film 121 is lower than an acoustic velocity of a bulk wave propagating through the piezoelectric film 122. The piezoelectric film 122 is directly or indirectly provided on the low acoustic velocity film 121. Regarding the electronic component module 100b according to the third preferred embodiment, elements the same as or similar to those of the electronic component module 100 according to the first preferred embodiment (see FIG. 1) are denoted by the same reference signs, and description thereof will not be repeated.

In the acoustic wave device 1b of the electronic component module 100b according to the third preferred embodiment, the high acoustic velocity film 120 prevents energy of the acoustic wave in a main mode from leaking to a structure below the high acoustic velocity film 120.

In the acoustic wave device 1b, when the thickness of the high acoustic velocity film 120 is sufficiently thick, the energy of the acoustic wave in the main mode is distributed throughout the piezoelectric film 122 and the low acoustic velocity film 121, and is also distributed on a portion of the high acoustic velocity film 120 on the side of the low acoustic velocity film 121, and is not distributed on the support substrate 11. A mechanism to confine the acoustic wave by the high acoustic velocity film 120 is the same mechanism as that of the surface acoustic wave of Love wave type, which is a non-leaky SH wave, and is described in, for example, the article "Introduction of Surface Acoustic Wave Device Simulation Technology", Kenya Hashimoto, Realize Inc., pp. 26-28. The above described mechanism is different from a mechanism to confine acoustic waves by a Bragg reflector with an acoustic multilayer film.

A material of the high acoustic velocity film 120 is preferably, for example, at least one material selected from the group consisting of diamond-like carbon, aluminum nitride, aluminum oxide, silicon carbide, silicon nitride, silicon, sapphire, piezoelectric material (lithium tantalate, lithium niobate, or quartz), alumina, zirconia, cordierite, mullite, steatite, forsterite, magnesia, and diamond. The material of the high acoustic velocity film 120 may be a material including any one of the materials described above as a main component or a material including a mixture including any of the materials described above as a main component.

Since the high acoustic velocity film 120 has the function of confining the acoustic wave in the piezoelectric film 122 and the low acoustic velocity film 121, it is preferable that the thickness of the high acoustic velocity film 120 is increased. By setting the thickness of the high acoustic velocity film 120 to equal to or more than about $0.3\lambda$, for example, the concentration rate of energy at a resonance point can be about 100%. Further, by setting the thickness of the high acoustic velocity film 120 to equal to or more than about $0.5\lambda$, for example, the concentration rate of energy at an anti-resonance point can also be about 100%, and further excellent device characteristics can be obtained.

In the electronic component module 100b according to the third preferred embodiment, the hollow portion 114 is provided in the support substrate 11 of the acoustic wave device 1b, similarly to the electronic component module 100 according to the first preferred embodiment. For this reason, for example, when the coefficient of linear expansion of the support substrate 11 is different from that of the mounting substrate 2, and thermal stress is generated in the support substrate 11, thermal stress is concentrated to a portion of the support substrate 11 in the first main surface 111 side of the hollow portion 114. Thus, thermal stress applied to the central portion of the support substrate 11 can be reduced or prevented, and stress strain in the central portion of the support substrate 11 due to the thermal stress can be reduced or prevented. As a result, deformation of the piezoelectric film 122 stacked on the central portion of the support substrate 11 can be reduced or prevented, and deterioration in characteristics (here, piezoelectricity) of the acoustic wave device 1b due to stress strain can be reduced or prevented.

Any one of the configurations according to the modified example of the first preferred embodiment may be combined with the electronic component module 100b according to the third preferred embodiment.

Fourth Preferred Embodiment

In an electronic component module 100c according to a fourth preferred embodiment of the present invention, as illustrated in FIG. 5, the functional layer 12 in an acoustic wave device 1c is the piezoelectric film 122. The piezoelectric film 122 is directly provided on the support substrate 11. Regarding the electronic component module 100c according to the fourth preferred embodiment, elements the same as or similar to those of the electronic component module 100 according to the first preferred embodiment (see FIG. 1) are denoted by the same reference signs, and description thereof will not be repeated.

In the acoustic wave device 1c according to the fourth preferred embodiment, the support substrate 11 defines a high acoustic velocity support substrate. In the high acoustic velocity support substrate, the acoustic velocity of the bulk wave propagating through the high acoustic velocity support substrate is higher than that of the acoustic wave propagating through the piezoelectric film 122. The functional layer 12 may include, for example, a close contact layer or a dielectric film or the like provided on the support substrate 11 side of the piezoelectric film 122, as a film other than the piezoelectric film 122. Further, the functional layer 12 may include a dielectric film or the like provided on the interdigital transducer electrode 13 side in the piezoelectric film 122.

Here, characteristics of the acoustic wave device 1c according to the fourth preferred embodiment will be described. In the following description, the piezoelectric film 122 is made of lithium tantalate, and the thickness of the piezoelectric film 122 is set to about 600 nm, for example. The support substrate 11 is made of silicon, and the thickness of the support substrate 11 is set to about 100 μm, for example.

The acoustic wave device 1c manufactured under the above conditions is placed under an environment of about 100° C., for example. In this case, since the coefficient of linear expansion of the spacer layer 17 and the cover 18 is different from that of the support substrate 11, thermal stress due to the difference in coefficient of linear expansion is generated in the support substrate 11. In the acoustic wave device 1c according to the fourth preferred embodiment, the hollow portion 114 is provided in the support substrate 11, and the thermal stress generated in the support substrate 11 is concentrated to a portion of the support substrate 11 in the first main surface 111 side of the hollow portion 114. As a result, the thermal stress applied to the central portion of the support substrate 11, i.e., to the portion in which the piezoelectric film 122 is stacked, can be reduced or prevented compared to the case where the hollow portion 114 is not provided in the support substrate 11. Specifically, thermal stress in the case where the hollow portion 114 is not provided in the support substrate 11 is, for example, about 11 MPa, whereas thermal stress in the case where the hollow portion 114 is formed in the support substrate 11 is, for example, about 7 MPa.

By forming the hollow portion 114 in the support substrate 11 as described above, thermal stress applied to the central portion of the support substrate 11 in which the piezoelectric film 122 is stacked can be reduced or prevented, and stress strain in the central portion of the support substrate 11 due to thermal stress can be reduced or prevented. As a result, deformation of the piezoelectric film 122 stacked on the central portion of the support substrate 11 can be reduced or prevented, and deterioration in characteristics (here, piezoelectricity) of the acoustic wave device 1c due to stress strain can be reduced or prevented.

The support substrate 11 and the piezoelectric film 122 may be integrally provided. That is, the support substrate 11 may be a piezoelectric substrate. Even in this case, when the hollow portion 114 is provided in the support substrate 11, the thermal stress generated in the support substrate 11 is concentrated to a portion of the support substrate 11 in the first main surface 111 side of the hollow portion 114. As a result, the thermal stress applied to the central portion of the support substrate 11 can be reduced or prevented compared to the case where the hollow portion 114 is not provided in the support substrate 11. Specifically, thermal stress in the case where the hollow portion 114 is not provided in the support substrate 11 is, for example, about 4 MPa, whereas thermal stress in the case where the hollow portion 114 is formed in the support substrate 11 is, for example, about 2 MPa.

Thus, by forming the hollow portion 114 in the support substrate 11, thermal stress applied to the central portion of the support substrate 11 can be reduced or prevented, and stress strain in the central portion of the support substrate 11 due to thermal stress can be reduced or prevented. As a result, deterioration in characteristics (here, piezoelectricity) of the acoustic wave device due to stress strain can be reduced or prevented.

Note that any one of the configurations according to the modified example of the first preferred embodiment may be combined with the electronic component module 100c according to the fourth preferred embodiment.

Summary

The following elements and features are disclosed in the preferred embodiments and the like described above.

An acoustic wave device (1; 1a; 1b; 1c) according to a preferred embodiment of the present invention is mounted on a mounting substrate (2). The acoustic wave device (1; 1a; 1b; 1c) includes a support substrate (2), a piezoelectric body layer (122), an interdigital transducer electrode (13)., and an external connection electrode (142). The piezoelectric body layer (122) is provided on the support substrate (2). The interdigital transducer electrode (13) is provided on the piezoelectric body layer (122). The external connection electrode (142) is electrically connected to the interdigital transducer electrode (13). The external connection electrode (142) does not overlap the piezoelectric body layer (122) in a plan view from a thickness direction (D1) of the support substrate (11) The support substrate (2) includes a hollow portion (114). The hollow portion (114) is provided at least on an end portion of the support substrate (11) in a plan view from the thickness direction (D1).

According to this preferred embodiment, it is possible to reduce or prevent deterioration in characteristics of the acoustic wave device (1; 1a; 1b; 1c).

In an acoustic wave device (1; 1a; 1b; 1c) according to a preferred embodiment of the present invention, the hollow portion (114) extends from the end portion of the support substrate (11) to at least a position overlapping the external connection electrode (142) in a plan view from the thickness direction (D1).

According to this preferred embodiment, it is possible to reduce or prevent deterioration in characteristics of the acoustic wave device (1; 1a; 1b; 1c).

An acoustic wave device (1; 1b; 1c) according to a preferred embodiment of the present invention further includes a spacer layer (17) and a cover (18). The spacer layer (17) is provided on the support substrate (11). The cover (18) is provided on the spacer layer (17). The external connection electrode (142) is provided on the cover (18). The hollow portion (114) extends from the end portion of the support substrate (11) to a position overlapping the spacer layer (17) in a plan view from the thickness direction (D1).

According to this preferred embodiment, it is possible to reduce or prevent deterioration in characteristics of the acoustic wave device (1; 1a; 1b; 1c).

In an acoustic wave device (1; 1a; 1b; 1c) according to a preferred embodiment of the present invention, the support substrate (11) is a silicon substrate. A surface (the first main surface 111) of the support substrate (11) on the piezoelectric body layer (122) side is a (111) plane.

In an acoustic wave device (1; 1a; 1b; 1c) according to a preferred embodiment of the present invention, the support substrate (11) includes the first main surface (111) on the piezoelectric body layer (122) side and a second main surface (112) back to back with the first main surface (111). The hollow portion (114) is provided nearer to the first main surface (111) side than to the second main surface (112) side in the thickness direction (D1).

According to this preferred embodiment, a portion of the support substrate (11) on the first main surface (111) side relative to the hollow portion (114) is more likely to deform, and as a result, deformation of the central portion in the support substrate (11) can be reduced or prevented.

An acoustic wave device (1; 1a) according to a preferred embodiment of the present invention further includes a low acoustic velocity film (121). The low acoustic velocity film (121) is provided between the support substrate (11) and the piezoelectric body layer (122). In the low acoustic velocity film (121), the acoustic velocity of a bulk wave propagating through the low acoustic velocity film (121) is lower than the acoustic velocity of a bulk wave propagating through the piezoelectric body layer (122). The support substrate (11) is a high acoustic velocity support substrate. In the high acoustic velocity support substrate, the acoustic velocity of a bulk wave propagating through the high acoustic velocity support substrate is higher than the acoustic velocity of an acoustic wave propagating through the piezoelectric body layer (122).

According to this preferred embodiment, a Q value of the acoustic wave device (1; 1a) can be increased.

An acoustic wave device (1b) according to a preferred embodiment of the present invention further includes a high acoustic velocity film (120) and the low acoustic velocity film (121). The high acoustic velocity film (120) is provided on the support substrate (11). In the high acoustic velocity film (120), the acoustic velocity of a bulk wave propagating through the high acoustic velocity film (120) is higher than the acoustic velocity of the acoustic wave propagating through the piezoelectric body layer (122). The low acoustic velocity film (121) is provided between the high acoustic velocity film (120) and the piezoelectric body layer (122). In the low acoustic velocity film (121), the acoustic velocity of the bulk wave propagating through the low acoustic velocity film (121) is lower than the acoustic velocity of the bulk wave propagating through the piezoelectric body layer (122).

According to this preferred embodiment, a Q value of the acoustic wave device (1b) can be increased.

An electronic component module (100; 100a; 100b; 100c) according to a preferred embodiment of the present invention includes an acoustic wave device (1; 1a; 1b; 1c) according to a preferred embodiment of the present invention, and the mounting substrate (2) on which the acoustic wave device (1; 1a; 1b; 1c) is mounted.

According to this preferred embodiment, it is possible to reduce or prevent deterioration in characteristics of the acoustic wave device (1; 1a; 1b; 1c).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
    a support substrate;
    a piezoelectric body layer on or above the support substrate;
    an interdigital transducer electrode on or above the piezoelectric body layer; and
    an external connection electrode electrically connected to the interdigital transducer electrode; wherein
    the external connection electrode does not overlap the piezoelectric body layer in a plan view from a thickness direction of the support substrate;
    the support substrate includes a hollow portion at least on an end portion of the support substrate in the plan view from the thickness direction; and
    the hollow portion does not extend to a portion overlapping the interdigital transducer electrode in the plan view from the thickness direction.

2. The acoustic wave device according to claim 1, wherein the hollow portion extends from the end portion of the support substrate to at least a position overlapping the external connection electrode, in the plan view from the thickness direction.

3. The acoustic wave device according to claim 1, further comprising:
    a spacer layer on or above the support substrate; and
    a cover on or above the spacer layer; wherein
    the external connection electrode is on or above the cover; and
    the hollow portion extends from the end portion of the support substrate to a position overlapping the spacer layer in the plan view from the thickness direction.

4. The acoustic wave device according to claim 1, wherein the support substrate is a silicon substrate; and
    a surface of the support substrate on the piezoelectric body layer side is a (111) plane.

5. The acoustic wave device according to claim 1, wherein the support substrate includes:
    a first main surface on the piezoelectric body layer side; and
    a second main surface back to back with the first main surface; and
    the hollow portion is nearer to a side of the first main surface than to a side of the second main surface in the thickness direction.

6. The acoustic wave device according to claim 1, further comprising:
    a low acoustic velocity film provided between the support substrate and the piezoelectric body layer, an acoustic velocity of a bulk wave propagating through the low acoustic velocity film being lower than an acoustic velocity of a bulk wave propagating through the piezoelectric body layer; wherein the support substrate is a high acoustic velocity support substrate, an acoustic velocity of a bulk wave propagating through the high acoustic velocity support substrate being higher than the acoustic velocity of the acoustic wave propagating through the piezoelectric body layer.

7. The acoustic wave device according to claim 1, further comprising:
a high acoustic velocity film on the support substrate, an acoustic velocity of a bulk wave propagating through the high acoustic velocity film being higher than an acoustic velocity of an acoustic wave propagating through the piezoelectric body layer; and
a low acoustic velocity film between the high acoustic velocity film and the piezoelectric body layer, an acoustic velocity of a bulk wave propagating through the low acoustic velocity film being lower than the acoustic velocity of the bulk wave propagating through the piezoelectric body layer.

8. The acoustic wave device according to claim 1, further comprising:
an insulating layer; and
a wiring electrode; wherein
the insulating layer is on or above the support substrate;
at least a portion of the wiring electrode is on or above the insulating layer; and
the wiring electrode is electrically connected to the interdigital transducer electrode and to the external connection electrode.

9. The acoustic wave device according to claim 8, wherein the wiring electrode overlaps a portion of the interdigital transducer electrode, a portion of the piezoelectric body layer, and a portion of the insulating layer in the thickness direction.

10. The acoustic wave device according to claim 8, wherein the insulating layer is provided along an outer periphery of the support substrate.

11. An electronic component module comprising:
the acoustic wave device according to claim 1; and
a mounting substrate on which the acoustic wave device is mounted.

12. The electronic component module according to claim 11, wherein the hollow portion extends from the end portion of the support substrate to at least a position overlapping the external connection electrode, in the plan view from the thickness direction.

13. The electronic component module according to claim 11, further comprising:
a spacer layer on or above the support substrate; and
a cover on or above the spacer layer; wherein
the external connection electrode is on or above the cover; and
the hollow portion extends from the end portion of the support substrate to a position overlapping the spacer layer in the plan view from the thickness direction.

14. The electronic component module according to claim 11, wherein the support substrate is a silicon substrate; and
a surface of the support substrate on the piezoelectric body layer side is a (111) plane.

15. The electronic component module according to claim 11, wherein
the support substrate includes:
a first main surface on the piezoelectric body layer side; and
a second main surface back to back with the first main surface; and
the hollow portion is nearer to a side of the first main surface than to a side of the second main surface in the thickness direction.

16. The electronic component module according to claim 11, further comprising:
a low acoustic velocity film between the support substrate and the piezoelectric body layer, an acoustic velocity of a bulk wave propagating through the low acoustic velocity film being lower than an acoustic velocity of a bulk wave propagating through the piezoelectric body layer; wherein
the support substrate is a high acoustic velocity support substrate, an acoustic velocity of a bulk wave propagating through the high acoustic velocity support substrate being higher than the acoustic velocity of the acoustic wave propagating through the piezoelectric body layer.

17. The electronic component module according to claim 11, further comprising:
a high acoustic velocity film on the support substrate, an acoustic velocity of a bulk wave propagating through the high acoustic velocity film being higher than an acoustic velocity of an acoustic wave propagating through the piezoelectric body layer; and
a low acoustic velocity film between the high acoustic velocity film and the piezoelectric body layer, an acoustic velocity of a bulk wave propagating through the low acoustic velocity film being lower than the acoustic velocity of the bulk wave propagating through the piezoelectric body layer.

18. The electronic component module according to claim 11, further comprising:
an insulating layer; and
a wiring electrode; wherein
the insulating layer is provided on or above the support substrate;
at least a portion of the wiring electrode is provided on or above the insulating layer; and
the wiring electrode is electrically connected to the interdigital transducer electrode and to the external connection electrode.

19. The electronic component module according to claim 18, wherein the wiring electrode overlaps a portion of the interdigital transducer electrode, a portion of the piezoelectric body layer, and a portion of the insulating layer in the thickness direction.

20. The electronic component module according to claim 18, wherein the insulating layer is provided along an outer periphery of the support substrate.

* * * * *